United States Patent
Vermeersch et al.

(10) Patent No.: US 9,735,302 B2
(45) Date of Patent: *Aug. 15, 2017

(54) METHOD FOR MANUFACTURING PHOTOVOLTAIC CELLS WITH MULTIPLE JUNCTIONS AND MULTIPLE ELECTRODES

(71) Applicant: Total Marketing Services, Puteaux (FR)

(72) Inventors: Marc Vermeersch, Le Vesinet (FR); Loic Francke, Nanterre (FR)

(73) Assignee: Total Marketing Services, Puteaux (FR)

( * ) Notice: Subject to any disclaimer, the term of this patent is extended or adjusted under 35 U.S.C. 154(b) by 214 days.

This patent is subject to a terminal disclaimer.

(21) Appl. No.: 14/487,303

(22) Filed: Sep. 16, 2014

(65) Prior Publication Data

US 2015/0059830 A1 Mar. 5, 2015

Related U.S. Application Data

(63) Continuation of application No. 13/382,296, filed as application No. PCT/IB2010/053107 on Jul. 7, 2010, now Pat. No. 8,859,885.

(30) Foreign Application Priority Data

Jul. 8, 2009 (FR) .................... 09 03376

(51) Int. Cl.
*H01L 31/076* (2012.01)
*H01L 31/18* (2006.01)
(Continued)

(52) U.S. Cl.
CPC ........ *H01L 31/076* (2013.01); *H01L 31/0201* (2013.01); *H01L 31/02008* (2013.01);
(Continued)

(58) Field of Classification Search
CPC ............... H01L 31/0468; H01L 31/043; H01L 31/0687; H01L 31/076
See application file for complete search history.

(56) References Cited

U.S. PATENT DOCUMENTS 3,957,537 A 5/1976 Baskett et al.
4,830,038 A 5/1989 Anderson et al.
(Continued)

FOREIGN PATENT DOCUMENTS

EP  2 065 942 A2  6/2009
EP  2 083 450 A1  7/2009
(Continued)

OTHER PUBLICATIONS

International Search Report of the ISA for PCT/IB2010/053107 dated Sep. 15, 2010.
(Continued)

*Primary Examiner* — Eric R Smith
(74) *Attorney, Agent, or Firm* — Daly, Crowley, Mofford & Durkee, LLP

(57) ABSTRACT

A photovoltaic device and method of manufacture of a photovoltaic device including an assembly of at least two photovoltaic cells; and a lamination material inserted between each photovoltaic cell, each photovoltaic cell including: two current output terminals; at least one photovoltaic junction; current collection buses; and connection strips extending from the current collection buses to the current output terminals, all the current output terminals being placed on a single surface of the photovoltaic device is provided.

18 Claims, 12 Drawing Sheets

(51) Int. Cl.
*H01L 31/02* (2006.01)
*H01L 31/043* (2014.01)
*H02S 20/23* (2014.01)
*H02S 20/26* (2014.01)
*H02S 40/34* (2014.01)
*H01L 31/0725* (2012.01)

(52) U.S. Cl.
CPC ...... *H01L 31/02013* (2013.01); *H01L 31/043* (2014.12); *H01L 31/0725* (2013.01); *H01L 31/18* (2013.01); *H02S 20/23* (2014.12); *H02S 20/26* (2014.12); *H02S 40/34* (2014.12); *H01L 2924/0002* (2013.01); *H01L 2924/09701* (2013.01); *Y02B 10/12* (2013.01); *Y02E 10/52* (2013.01)

(56) References Cited

U.S. PATENT DOCUMENTS

| | | | | |
|---|---|---|---|---|
| 5,131,954 A | * | 7/1992 | Vogeli | H01L 31/0236 136/244 |
| 8,859,885 B2 | | 10/2014 | Vermeersch et al. | |
| 2001/0047819 A1 | * | 12/2001 | Sannomiya | H01L 31/048 136/244 |
| 2006/0180197 A1 | * | 8/2006 | Gui | H01G 9/2031 136/255 |
| 2008/0092952 A1 | * | 4/2008 | Chen | H01L 31/0745 136/258 |
| 2008/0236655 A1 | | 10/2008 | Baldwin et al. | |
| 2010/0116330 A1 | * | 5/2010 | Inoue | H01L 31/02013 136/256 |
| 2010/0170556 A1 | * | 7/2010 | Frolov | H01L 31/042 136/244 |

FOREIGN PATENT DOCUMENTS

| | | | |
|---|---|---|---|
| JP | WO 2008093563 A1 * | 8/2008 | ....... H01L 31/02013 |
| WO | WO 03/100868 A1 | 12/2003 | |
| WO | WO 2008/059593 A1 | 5/2008 | |
| WO | WO 2008/091098 A1 | 7/2008 | |
| WO | WO 2009/006230 A2 | 1/2009 | |

OTHER PUBLICATIONS

Written Opinion of the ISA for PCT/IB2010/53107 dated Sep. 15, 2010.
U.S. Appl. No. 13/382,296, filed Jan. 5, 2012.

* cited by examiner

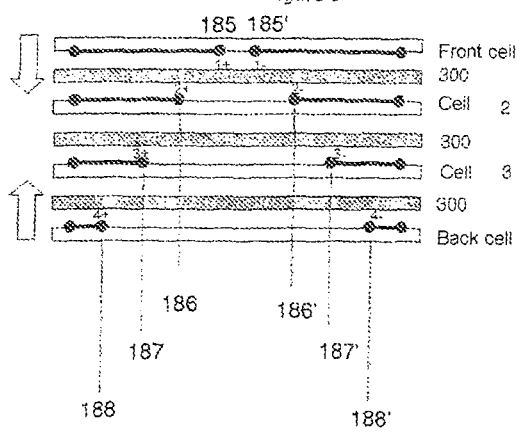
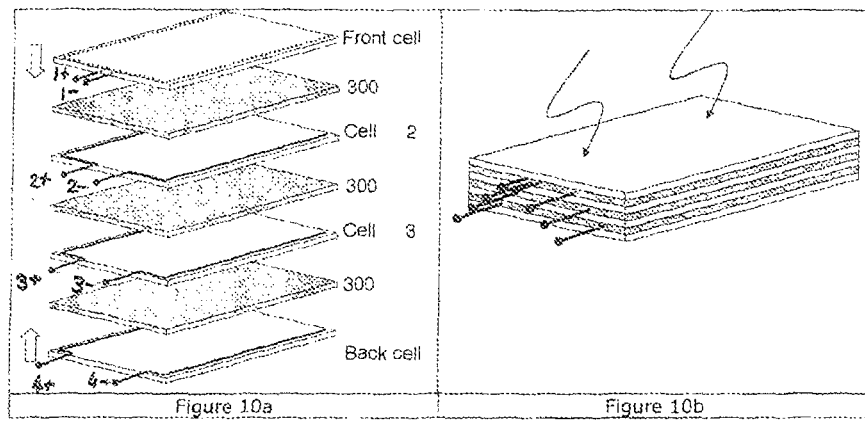

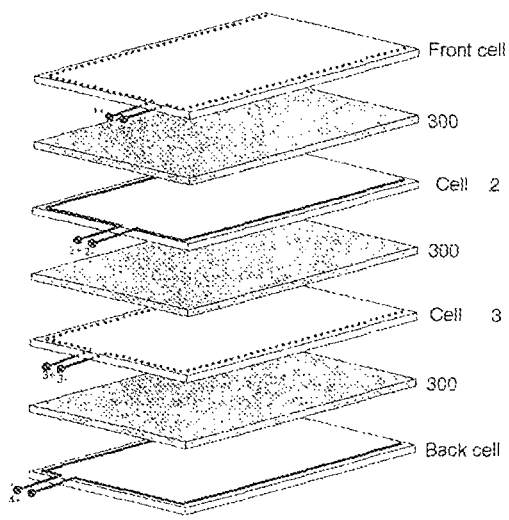
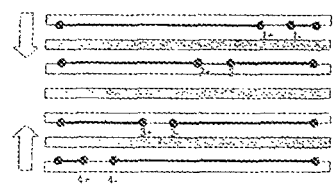
Figure 10c
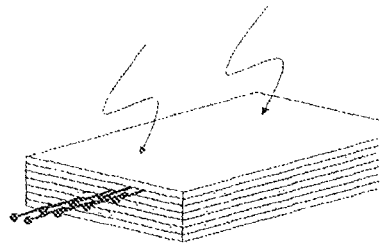
Figure 10d
Figure 10e

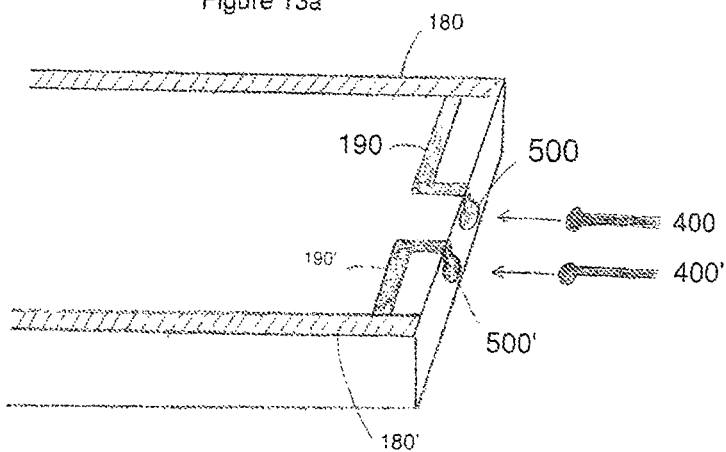
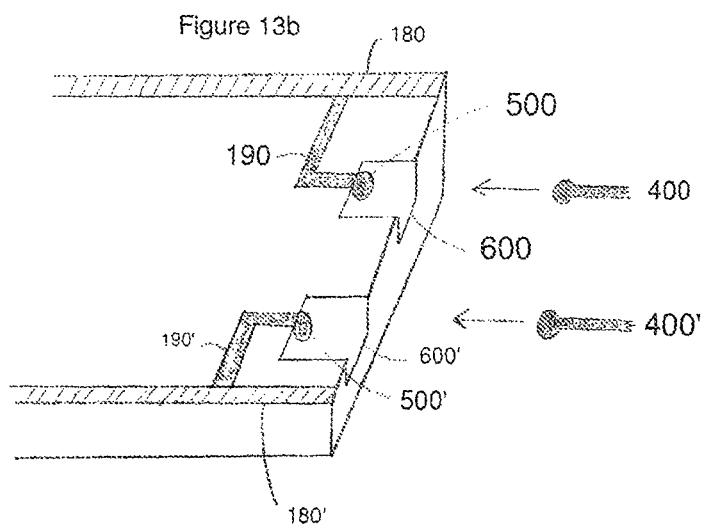

METHOD FOR MANUFACTURING PHOTOVOLTAIC CELLS WITH MULTIPLE JUNCTIONS AND MULTIPLE ELECTRODES

CROSS REFERENCE TO RELATED APPLICATIONS

This application is a continuation of U.S. patent application Ser. No. 13/382,296 entitled METHOD FOR MANUFACTURING PHOTOVOLTAIC CELLS WITH MULTIPLE JUNCTIONS, which was filed on Jan. 5, 2012 and is a National Stage application of PCT Application PCT/IB2010/053107 entitled METHOD FOR MANUFACTURING PHOTOVOLTAIC CELLS WITH MULTIPLE JUNCTIONS AND MULTIPLE ELECTRODES, which was filed on Jul. 7, 2010, published in the French language, and claims priority to French application FR0903376 filed on Jul. 8, 2009.

STATEMENT REGARDING FEDERALLY SPONSORED RESEARCH

Not Applicable.

FIELD

The present disclosure relates to the field of photovoltaic devices and more particularly to multijunction devices comprising what are called tandem cells. The disclosure also relates to the manufacture of photovoltaic devices comprising cells with multiple electrodes, in which devices comprise a plurality of photovoltaic cells deposited on independent substrates are associated to manufacture a multielectrode photovoltaic module which allows direct access to all of the electrodes and which removes the risk of short-circuits between these electrodes.

BACKGROUND

As is known in the art, a photovoltaic generator (PVG) comprises a plurality of photovoltaic cells (PVs) connected in series and/or in parallel. A photovoltaic cell is a semiconductor diode (p-n or p-i-n junction) designed to absorb light energy and convert it into electrical power. When photons are absorbed by the semiconductor, they transfer their energy to the atoms of the p-n junction so that the electrons of these atoms are freed and create free electrons (n-type charge) and holes (p-type charge). A potential difference then appears between the two (p-type and n-type) layers of the junction. This potential difference can be measured between the positive and negative terminals of the cell. The maximum voltage of a cell is typically about 0.6 V for zero current (open circuit) and the maximum current that can be delivered by the cell is highly dependent on the level of sunlight received by the cell.

The expression "tandem junction photovoltaic cell" denotes a muitijunction cell consisting of two simple junctions stacked one on top of the other so as to increase the bandwidth of the solar spectrum absorbed by the cell. Depending on the technology, the two junctions may be in direct contact with each other or in indirect contact via an intermediate film of transparent conductive oxide. In the latter case, the transparent conductive oxide intermediate between the two junctions acts as an intermediate reflector for increasing the optical path length of the light via multiple reflections.

FIG. 1, for example, shows a schematic of a tandem cell composed of a first junction made of amorphous silicon (a-Si:H) and a second junction made of microcrystalline silicon ($\mu$c-Si:H) in direct contact in cross section along the path of the incident light. The relative thicknesses of the various films have not been shown to scale in FIG. 1. The various materials are deposited as thin films on a glass substrate 10 by PVD (physical vapor deposition) or PECVD (plasma enhanced chemical vapor deposition). The following are thus deposited in succession: a first transparent conductive electrode 11, a first simple p-i-n junction 15 forming the front photovoltaic cell, a second simple p-i-n junction 16 forming the back photovoltaic cell, a second transparent conductive electrode 12 and a back reflector 20. For practical reasons relating to manufacture, tandem-cell architectures are at the present time mainly produced in what is called thin-film technology, whether the cads are inorganic, organic or hybrid (inorganic/organic). In thin-film technologies, the physical superposition of the photovoltaic cells is achieved by depositing in succession appropriate sequences of electrodes 11, 12, for collecting the current produced, and active films 15, 16.

Tandem cells are considered to be a key advanced technology in the photovoltaic device fields mainly because of their electrical conversion efficiencies. Specifically, production of tandem architectures consists in physically superposing (relative to the expected direction of incident light) two photovoltaic cells having respective optical absorption bands that are shifted in energy. Optically coupling the cells provides the array (i.e. the tandem) with an overall absorption bandwidth that is higher than that of the separate cells. The electrical conversion efficiency is thereby increased providing that this optical absorption can be converted into electrical energy and extracted.

FIG. 2, for example, is a plot illustrating the conversion efficiency expressed in percentage (%) for a tandem cell made of thin silicon films. The respective absorption bands of the superposed cells ("upper cell" for the front cell and "lower cell" for the back cell) and the overall absorption band of the cell ("superposition") are shown. Tandem-cell technology is one way of increasing the energy performance of photovoltaic generators. Various tandem-cell architectures have thus been developed in the last few years. The reader may refer for example to documents EP-A-1 906 457, US-A-2008/0023059 or WO 2004/112161. These documents each provide various assemblies of photovoltaic materials aiming to increase the energy absorbed by the array.

The tandem cells described above are characterized by a double coupling: optical coupling due to the stack of active photovoltaic cells in various bands of the solar spectrum; and electrical coupling via direct or indirect contact of the two junctions and the presence of two electrodes at the ends of the tandem.

A major drawback of the electrical coupling of a tandem cell is that the currents generated by the photovoltaic cells forming the tandem need to match, whatever the solar conditions. This ideal case is in fact not possible because the current generated by each cell intentionally depends on the region of the spectrum in which they are active and varies depending on the solar conditions. This means that the tandem cell is intrinsically limited by the weakest of its elements. Such a limitation on current greatly reduces the theoretical efficiency of a tandem cell.

It has therefore been proposed to electrically decouple the junctions of a tandem cell. The photovoltaic cells of the tandem are still optically coupled but are electrically decoupled. Each junction is associated with two electrical electrodes and thus a tandem photovoltaic cell is obtained having four electrodes, two electrodes for each of the two tandem junctions. A film of material that is transparent to light and electrically insulating is inserted between the electrodes of adjacent junctions.

The electrodes of the tandem cell are, in general, electrically connected by way of current output terminals, via a junction box, to en electronic device for converting a direct-current (DC) voltage into an alternating current (AC) voltage compatible with the mains grid. This device also allows the array of photovoltaic cells to be controlled, or even each of the cells to be controlled independently. The two current output terminals of a photovoltaic cell are, in general, located either on opposite sides of the photovoltaic cell in two junction boxes, or in the center of the cell in a single junction box. FIG. 1 of U.S. Pat. No. 4,461,922, for example, shows two superposed tandem cells forming a module having current output terminals located on opposite sides of the module. Control of the module therefore requires that two junction boxes be placed on opposite faces of the module. Arranging junction boxes on opposite sides of the module has the drawback of making the assembly consisting of the module and the junction boxes bulky.

Furthermore, when two identical photovoltaic cells are directly superposed, the current output terminals are separated only by a very small distance, for example equal to the thickness of the film of insulating material that is transparent to light and intermediate between two adjacent photovoltaic cells. This thickness is about a millimeter or less. Superposition of these photovoltaic cells therefore implies superposition of electrical contact strips belonging to each of the two mils and the risk of short-circuits within the 4-wire photovoltaic cell formed. In addition, access to the electrodes is made difficult because of the small space separating the electrodes of a given polarity located in two adjacent photovoltaic cells. It is therefore difficult to connect them to a junction box.

There is therefore a need for a multijunction and multi-terminal photovoltaic device in which the risk of short-circuits between the current-collecting strips of each of the cells is as small as possible and which can be controlled via a single junction box. In particular, there is a need for a method for manufacturing a multijunction photovoltaic device that makes connecting the current output terminals of each photovoltaic cell to the junction box easier.

SUMMARY

For this purpose, in one aspect this disclosure provides a photovoltaic device comprising: en assembly of at least two photovoltaic cells; a lamination interlayer placed between each photovoltaic cell, each photovoltaic cell comprising: two current output terminals, at least one photovoltaic junction, current-collecting buses, and connecting strips that extend from the current-collecting buses to the current output terminals, all the output terminals for current output being placed on the same face of the photovoltaic device.

Features of the photovoltaic device may include one or more of the following either individually or in combination. The photovoltaic device is parallelepiped shaped and the current output terminals is placed on one of the side faces of the parallelepiped and the current output terminals may be shifted relative to each other. The photovoltaic device is parallelepiped shaped and the current output terminals are placed on the lower or upper face of the parallelepiped. The current output terminals are aligned, preferably near the side face of the device. The current output terminals are wires. The current output terminals are contacts at the ends of the connecting strips.

Features of the photovoltaic device may additionally, or alternatively, include one or more of the following either individually or in combination. The device comprises n photovoltaic cells, n being 2 or more, and comprises: a front photovoltaic cell, at least one intermediate photovoltaic cell ($1<i<n$), if n is strictly greater than 2, a back photovoltaic cell n, each intermediate photovoltaic cell i comprising $2(i-1)$ apertures for passing extension pieces coming from the photovoltaic cells 1 to $(i-1)$ and optionally two apertures for passing current output terminals from the photovoltaic cell i, the back photovoltaic cell n comprising $2(n-1)$ apertures for passing extension pieces coming from the photovoltaic cells 1 to $(n-1)$ and optionally two apertures for passing current output terminals from the photovoltaic cell n.

In one embodiment, the device comprises n photovoltaic cells, n being 2 or more, and comprises: a front photovoltaic cell, at least one intermediate photovoltaic cell ($1<i<n$), if n is strictly greater than 2, a beck photovoltaic cell n, each intermediate photovoltaic cell i comprising $2(i-1)$ apertures (351, 352) allowing the contacts of the photovoltaic cells 1 to $(i-1)$ to be fitted into plugs of a junction box and optionally two apertures (350, 353) allowing the contacts of the photovoltaic cell i to be fitted into plugs of the junction box, the back photovoltaic cell n comprising $2(n-1)$ apertures (371-376) allowing the contacts of the photovoltaic cells 1 to $(n-1)$ to be fitted into plugs of the junction box and optionally two additional apertures (370, 377) allowing the contacts of the photovoltaic cell n to be fitted into plugs of the junction box.

In another embodiment, the back photovoltaic cell comprises a film of a light-reflecting material. It is used as a roof component, a roof for a building, or a non transparent we cladding for a building.

In another embodiment, the back photovoltaic cell does not comprise a film of a light-reflecting material. The device is used as a window component for a building.

In another embodiment, the photovoltaic junction material is chosen from the group comprising: microcrystalline silicon, polymorphous silicon and amorphous silicon; cadmium telluride CdTe associated with a cadmium sulfide CdS buffer layer; the chalcopyrites $CuIn_{1-x}Ga_x(Se, S)_2$, where x lies between 0 and 1, associated with a cadmium sulfide CdS or indium sulfide $In_2S_3$ buffer layer; hydrogenated, amorphous alloys of silicon and germanium $Si_xGe_{1-x}$; and organic materials based on poly(3-hexylthiophene) and [6,6]-phenyl-C61-butyric acid methyl; and mixtures of the above.

In another embodiment, two electrodes consisting of a transparent conductive oxide (TCO) are present on each face of the junction.

In another embodiment, the current output terminals are gathered together in a junction box forming a first group consisting of positive current output terminals and a second group consisting of negative current output terminals.

In another embodiment, the current output terminals are grouped in pairs consisting of a positive electrode and a negative electrode, each pair being placed in a junction box or all the pairs being placed in a single junction box. According to another embodiment, the photovoltaic array comprises n junction boxes.

Another subject of the disclosure is a photovoltaic array comprising a device such as described above, and at least one junction box. According to another embodiment, the photovoltaic array comprises a single junction box.

Another subject of the disclosure is a method for manufacturing a photovoltaic device such as described above. This method comprises laminating photovoltaic cells and lamination interlayers.

In one embodiment, a method for manufacturing a photovoltaic device comprises: stacking: a front photovoltaic cell, an apertured lamination interlayer, the apertures facing the current output terminals of the front photovoltaic cell, on which the lamination interlayer is deposited, at least one intermediate photovoltaic cell each intermediate photovoltaic cell i comprising 2(i−1) apertures for passing extension pieces coming from the photovoltaic cells 1 to (i−1) and optionally two apertures for passing current output terminals from the photovoltaic call i; an apertured lamination interlayer, the apertures facing the current output terminals of the photovoltaic cell i, on which the lamination interlayer is deposited, a back photovoltaic cell n comprising 2(n−1) apertures for passing extension pieces coming from the photovoltaic cells 1 to (i−1) and optionally two apertures for passing current output terminals from the photovoltaic cell n to form a stack; passing extension pieces and current output terminals through the apertures; and laminating the stack, the lamination possibly being obtained by sequential operations after each cell or each interlayer has been deposited, or possibly being obtained in a single step after the cells and the interlayers have been assembled.

In another embodiment, the method comprises: stacking: a front photovoltaic cell; an apertured lamination interlayer, the apertures facing the current output terminals of the front photovoltaic cell, on which the lamination interlayer is deposited; at least one intermediate photovoltaic cell i comprising 2(i−1) apertures allowing the contacts of the photovoltaic cells 1 to (i−1) to be fitted into plugs of a junction box and optionally two apertures allowing the contacts of the photovoltaic cell i to be fitted into plugs of the junction box; an apertured lamination interlayer, the apertures facing the current output terminals of the photovoltaic cell i, on which the lamination interlayer is deposited; a back photovoltaic cell n comprising 2(n−1) apertures allowing the contacts of the photovoltaic cells 1 to (n−1) to be fitted into plugs of the junction box and optionally two additional apertures allowing the contacts of the photovoltaic cell n to be fitted into plugs of the junction box to form a stack; and laminating the stack, the lamination possibly being obtained by sequential operations after each cell or interlayer has been deposited, or possibly being obtained in a single step after the cells and the interlayers have been assembled.

Features of the method may include one or more of the following either individually or in combination. The connecting strips are equipped with a contact at their end. The current output terminals are wires and are held on one of the side surfaces of the device on the exterior of the photovoltaic cells. The photovoltaic cells have contact terminals located on the side face of the photovoltaic cells or located in a housing opening onto the side face of the photovoltaic cells.

According to another embodiment, a method comprises: stacking: a front photovoltaic cell comprising two extension pieces, an unapertured lamination interlayer, at least one intermediate photovoltaic cell i, each intermediate photovoltaic cell i comprising 2 extension pieces shifted relative to the 2(i−1) extension pieces of the photovoltaic cells 1 to (i−1); an unapertured lamination interlayer; and a back photovoltaic cell n comprising 2 extension pieces shifted relative to the 2(n−1) extension pieces of the photovoltaic cells 1 to (n−1), the extension pieces protruding beyond the same face of the photovoltaic device to form a stack; laminating the stack, the lamination in one aspect being obtained by sequential operations after each cell or each interlayer has been deposited, or being obtained in a single step after the cells and the interlayers have been assembled.

BRIEF DESCRIPTION OF THE DRAWINGS

Other features and advantages of the disclosure will become clear on reading the following description of embodiments of the disclosure, given by way of example and with reference to the annexed drawings, which show:

FIG. 9 is a working diagram of the wiring according to the disclosure;

FIG. 10a is example stack of four 2-electrode cells in the "edge face electrode" configuration (or "side face electrodes") before assembly according to the disclosure;

FIG. 10b is an example stack of four 2-electrode cells in the "edge face electrode" configuration (or "side face electrodes") after assembly according to the disclosure;

FIG. 10c is schematic view of an example stack of four 2-electrode cells in the "edge face electrode" configuration (or "side face electrodes") after assembly according to the disclosure;

FIG. 10d is a schematic view of an example stack of four 2-electrode cells in the "edge face electrode" configuration (or "side face electrodes") before assembly according to the disclosure;

FIG. 10e is a schematic view of an example stack of four 2-electrode cells in the "edge face electrode" configuration (or "side face electrodes") after assembly according to the disclosure;

Figure 14A:
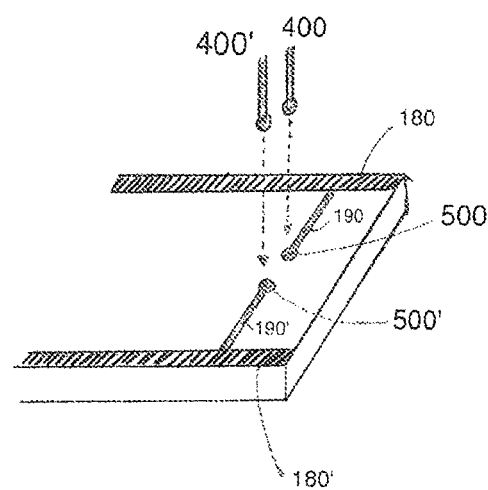
Figure 14B:
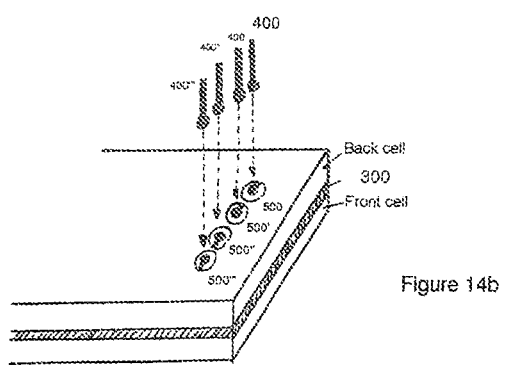

(1<I<n), arranged in the stack so that face E corresponds to face B and face S corresponds to face A, placed in a multijunction and multielectrode cell, in the "back face electrode" configuration;

FIGS. 13a and 13b are photovoltaic cell the current output terminals of which are contacts at the ends of connecting strips; the contact may be located either on the edge face (or side face) of the photovoltaic cell (FIG. 13a), or in a housing located on the edge face (or side face) of the photovoltaic cell (FIG. 13b); plugs cooperate with the contacts; and FIGS. 14a and 14b are photovoltaic cell the current output terminals of which are contacts at the ends of connecting strips; the contact may be located on the back face of the photovoltaic cell (FIG. 14b); plugs cooperate with the contacts on the back face of the photovoltaic cell.

DETAILED DESCRIPTION

In one aspect, the disclosure provides a method for manufacturing a multijunction and multielectrode photovoltaic device which enables direct access to the two electrodes of each of the n photovoltaic cells.

Firstly, the structure of a photovoltaic cell with two electrically decoupled tandem junctions (four electrodes) is described; it will however be understood that the method of the disclosure may be employed to manufacture modules comprising an assembly of n multijunction photovoltaic cells (n≥2).

Figure 1:
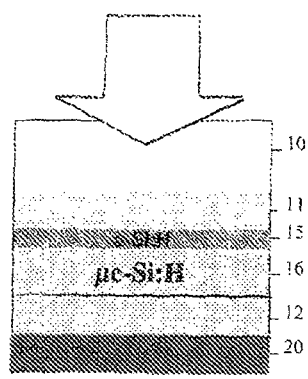
FIG. 1, described above, is a tandem-junction photovoltaic cell in accordance with prior art.
Figure 2:
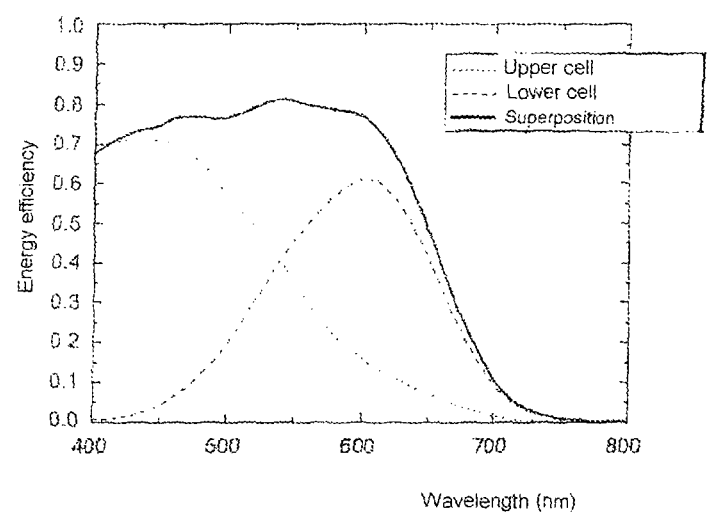
FIG. 2, described above, is an energy-efficiency plot for a tandem-junction photovoltaic cell in accordance with prior art.
Figure 3:
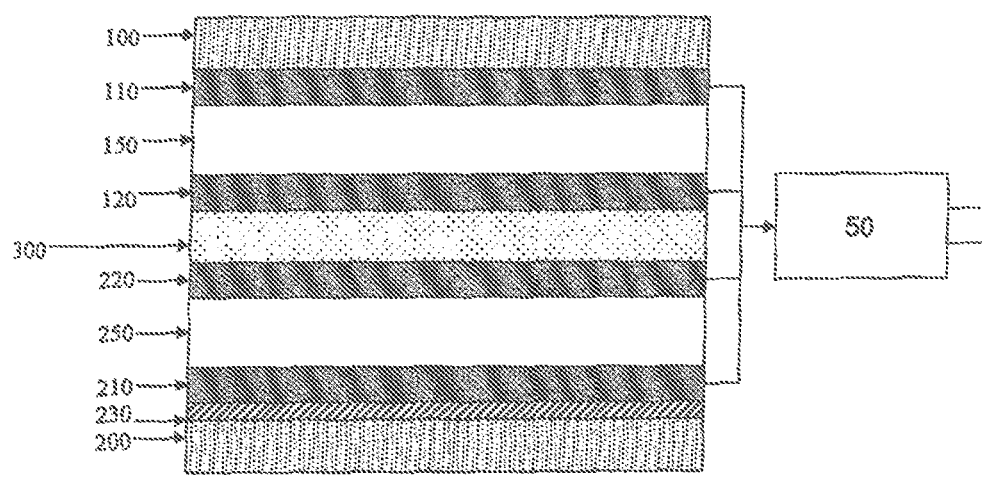
FIG. 3 is a schematic of a tandem-junction photovoltaic cell according to the disclosure.

FIG. 3 illustrates schematically a cross-sectional view of a tandem junction photovoltaic cell with four electrodes for outputting current to a junction box.

FIG. 3 shows, in succession (from top to bottom), a first substrate 100 supporting a first photovoltaic cell comprising a first electrode 110 and a second electrode 120 flanking a first photovoltaic junction 150. A film 300 of transparent and electrically insulating material separates the first photovoltaic cell from a second cell comprising a first electrode 210 and a second electrode 220 flanking a second photovoltaic junction 250. A back reflective film 230 may be provided under the second photovoltaic call. Lastly, FIG. 3 shows a second substrate 200. The electrodes 110, 120, 210 and 220 are connected to a junction box 50.

Figure 4:
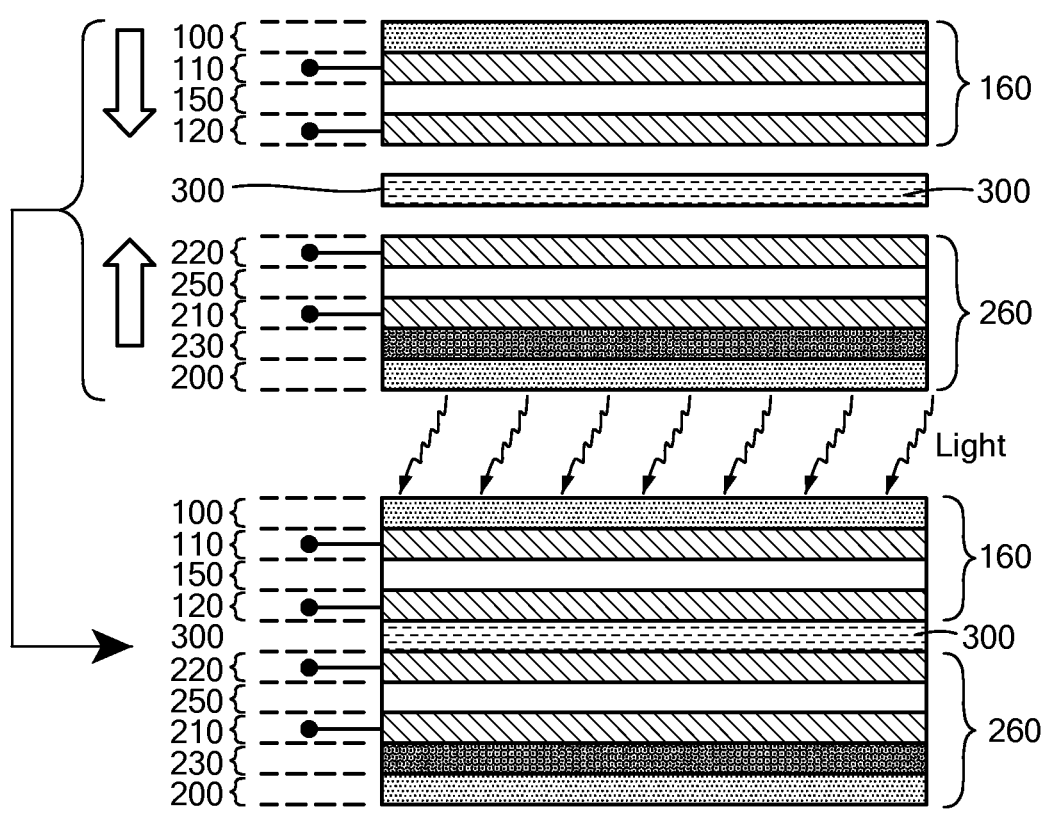
FIG. 4 is a schematic view of the assembly of tandem cells according to a method of the disclosure.

FIG. 4 illustrates schematically the step of assembling two photovoltaic cells manufactured separately. The cells 160, 260 are then assembled on either side of a resin film 300 that is transparent to light. The assembly may be achieved via lamination for example.

Figure 5:
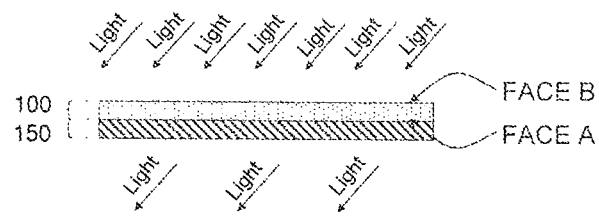
FIG. 5 is a description of faces A and B of the substrates.
Figure 6:
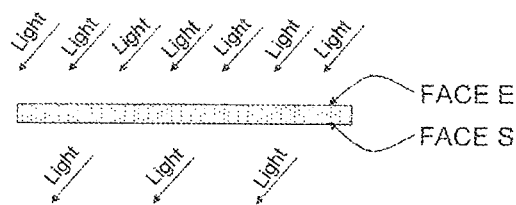
FIG. 6 is a description of the faces of a photovoltaic cell where in one aspect face E is the entrance face of the light and face S is the exit face of the light.

FIG. 3 shows an assembly limited to two photovoltaic cells but a module may comprise n photovoltaic cells, n being greater than 2. In such a case, 3 types of photovoltaic cell are distinguished within the module: the front photovoltaic cell (i=1) i.e. the first cell passed through by the light rays; intermediate photovoltaic cells (1<i<n); the back photovoltaic cell (i=n) i.e. the last to receive the light rays. Each substrate comprises two faces (see FIG. 5): a face A on which the absorber of light energy (junction) is deposited; a face B which bears no deposition specific to the photovoltaic conversion of the solar radiation. Each photovoltaic cell comprises two faces (see FIG. 6): an entrance face E through which the solar radiation arrives; an exit face S from which the solar radiation leaves after having passed through the array of the substrate and the various thin films or from which the solar radiation is reflected after having passed through the array of the substrate and the various thin films.

For the stack of independent cells, the disclosure describes a stack such that: for the front, two electrode photovoltaic cell (i=1), the face E corresponds to the face and the face S corresponds to the face A; for each intermediate, two-electrode photovoltaic cell (1<i<n), the face E corresponds to the face B and the face S corresponds to the face A; for the back, two-electrode photovoltaic cell (i=n), the face E corresponds to the face A and the face S corresponds to the face B.

However, it is entirely possible, n the case of the intermediate, two-electrode photovoltaic cells (1<i<n), for some or all of them to be placed in the configuration which the face E corresponds to the face A and the face S corresponds to the face B.

Each photovoltaic cell is prepared on an independent substrate.

The substrates of the front (i=1) and intermediate (1<i<n) cells are transparent to solar radiation so as to allow the latter to reach the absorbing material of each of the photovoltaic cells of the stack.

These substrates may for example be made entirely of glass or of a thermoplastic such as polyurethane or polycarbonate or polymethyl methacrylate. These substrates are chosen to have the best possible transparency in the part of the spectrum useful to the application of the photovoltaic system.

It is not necessary for the substrate of the back photovoltaic cell to be transparent. This substrate may, for example, be made of stainless steel, glass, a polymer, a ceramic or of a composite of a number of these elements.

Preparation of the Substrates:

The substrate used for the production of the photovoltaic cell i is thermally, chemically and mechanically stable and compatible with all the methods and processes for manufacturing the two-electrode photovoltaic cell i, but also with the methods and processes for manufacturing the final multi-electrode cell. All the substrates have the same dimensions.

Preparation of the Photovoltaic Cells on the Substrates:

The manufacture of the front, intermediate and back, two-electrode photovoltaic cells is briefly described, it being understood that this description is applicable to the manufacture of each cell of the multielectrode photovoltaic device according to the disclosure before assembly of said cells. The manufacture of each two-electrode photovoltaic cell forming the final multielectrode photovoltaic cell may be carried out on production lines that are totally independent, whether from the point of view of the equipment used or from the point of view of location. Each cell may be manufactured by any existing method, especially by deposition of thin films on a substrate.

A first transparent-conductive-oxide-based electrode is deposited on the substrate. The transparent conductive oxide film typically has a thickness of about 0.05 μm to 10 μm and is for example based on fluorine-doped fin oxide ($SnO_2$:F), aluminum-doped zinc oxide (ZnO:Al), boron-doped zinc oxide (ZnO:B) or indium tin oxide (ITO). It is as transparent as possible and transmits as much of the solar radiation as possible in the wavelength range corresponding to the absorption spectrum of the materials forming the absorbent material of the photovoltaic cell i and of the following array of photovoltaic cells (from i+1 to n), so as not to reduce the overall conversion efficiency of the final multielectrode photovoltaic module. This film of transparent conductive oxide may, for example, be deposited by cathode sputtering, LPCVD (low-pressure chemical vapor deposition) or MOCVD (metal organic chemical vapor deposition).

In the case of the back, two-electrode photovoltaic cell (i=1), it is also possible to employ a back reflector which may be made of aluminum (Al), silver (Ag), molybdenum (Mo), copper (Cu) or of titanium nitride (TiN) for example. This back reflector is deposited between the substrate and the first transparent conductive electrode. A back reflector may, for example, be deposited using a cathode sputtering technology or by reactive cathode sputtering. This embodiment is particularly suitable for applications in which the photovoltaic-cell module is placed on the roof of a dwelling or factory because it allows light to be reflected toward the outside.

This transparent-conductive-oxide film may then optionally be textured, for example using a plasma-etching technology or chemically via immersion in a solution of hydrochloric acid (HCl), so as to improve the optical confinement of the solar radiation and thus improve the overall conversion efficiency of the final multielectrode photovoltaic module.

Next, the absorbent material enabling the photovoltaic conversion of the solar radiation is deposited on the surface of the first transparent conductive electrode. This may for example be a p-i-n junction or an n-i-p junction absorber made of hydrogenated amorphous silicon, a p-i-n junction or an n-i-p junction absorber made of hydrogenated polymorphous silicon, or (T) a p-i-n junction or an n-i-p junction absorber made of hydrogenated microcrystalline silicon; or a thin-film absorber of the multijunction type such as a tandem junction the first p-i-n junction of which is based on amorphous silicon and the second p-i-n junction of which is based on microcrystalline silicon; or an absorber based on cadmium telluride (CdTe) associated with a buffer layer made of cadmium sulfide (CdS); or an absorber based on a chalcopyrite such as for example the $Cu(In_xGa_{1-x})(Se,S_2)$ alloy, where x lies between 0 and 1, associated with a buffer layer made of cadmium sulfide (CdS) or of indium sulfide ($In_2S_3$); or an absorber based on a hydrogenated amorphous ahoy of silicon and germanium $Si_xGe_{1-x}$; or an organic absorber of the poly(3-hexylthiophene) and [6,6]-phenyl-C61-butyric acid methyl (P3HT/PCBM) type—for example.

Preferably, the materials used to manufacture the junctions have different solar-radiation absorption capacities. The absorbing material used for the photovoltaic cell i is highly transmissive in the wavelength range corresponding to the absorption spectrum of the materials forming the absorbing material of the following photovoltaic cells (from i+1 to n), in order not to reduce the overall conversion efficiency of the final muitielectrode photovoltaic module. For example, in the case of a four-electrode cell (n=2), i.e. manufactured from two cells each with two independent electrodes, it will be possible to choose, for the front cell (i=1), an absorber consisting of a p-i-n or n-i-p junction made of hydrogenated amorphous silicon, and for the back cell (i=2) an absorber consisting of a p-i-n or n-i-p junction made of hydrogenated microcrystalline silicon.

Finally, a second transparent and conductive electrode is deposited on the surface of the absorber. The transparent conductive oxide film, based on $SnO_2$:F, ZnO:Al, ZnO:B or ITO, for example, is as transparent as possible and is highly transmissive of solar radiation in the wavelength range corresponding to the absorption spectrum of the materials forming the absorbing material of the photovoltaic cell i and of all of the following photovoltaic cells (from i+1 to n), in order not to reduce the overall conversion efficiency of the final multielectrode photovoltaic module.

As known in the art, steps of segmenting the various thin films into cells by laser etching, mechanical etching or by the lift-off process, for example, and steps of cleaning the various surfaces may be carried out between the deposition steps in order to form a network of photovoltaic cells connected in series on one and the same substrate. These successive steps of segmenting the various thin films thus allow the various cells formed on the surface of the substrate to be associated in series during the segmentation steps via a monolithic integration. Steps of cleaning of the various surfaces may be carried out between the deposition and segmentation steps.

An additional step of electrically isolating the periphery of the films may also be carried out on surface A of the substrate. This isolation may, for example, be carded out by way of a method employing a laser.

Finally, a strip of all the films deposited on substrate surface A is removed at the periphery of the substrate so as to define a zone exempt from any deposit. This removal of all the films at the periphery of the substrate makes it possible, on the one hand, to isolate the absorbing materials from the external environment and, on the other hand, to bring the lamination interlayer into direct contact with the substrate at its periphery, allowing better isolation with regard to moisture and oxygen. Typically, the strip removed from the periphery has a width of between 10 mm and 15 mm.

This abrasion of the films on the periphery may be carried out, for example, by laser ablation or by mechanical abrasion using a sand-blasting method employing a corundum powder for example or using en abrasive wheel.

Figure 7:
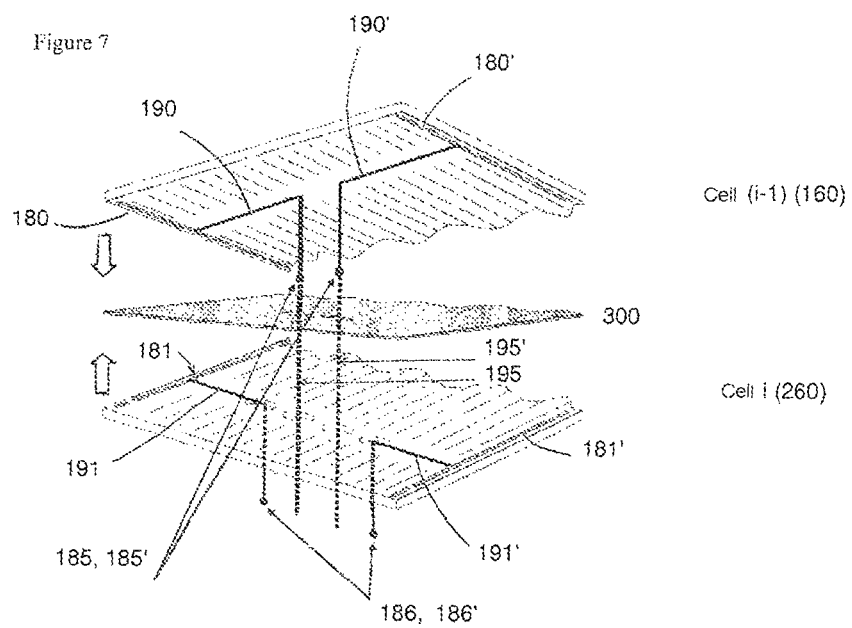
FIG. 7 is a schematic view of the electrical wiring of the photovoltaic device according to the disclosure.

Wiring of the Photovoltaic Cells:

The architecture of the electrical wiring of the photovoltaic cells characterizes the disclosure. Reference is made to FIGS. 7-12. In FIG. 7, current-collecting buses (180, 180', 181, 181") are placed laterally at either end of a cell i by monolithic integration in series so as to allow electrons generated by this photovoltaic cell to be collected. The collecting buses extend over the side edges of the substrate. To place these side collecting buses, it is possible to use automatic soldering machines or even to make the connections manually.

Figure 8:
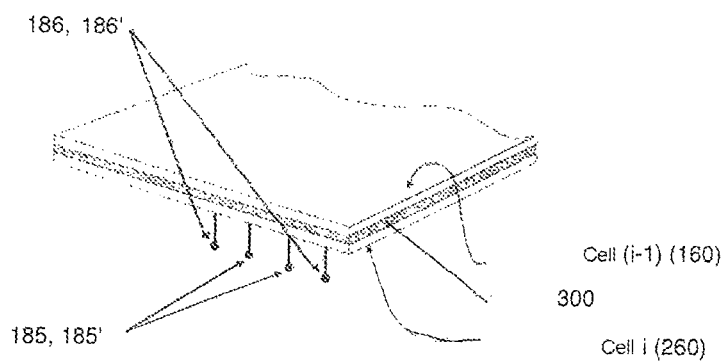
FIG. 8 is a schematic view of the "back face electrode" configuration according to the disclosure.

Two connecting ships (190, 190', 191, 191') are then connected to each collecting bus. Each connecting strip serves as a link between the two electrical collecting buses and contact zones external to the module. The connecting strips lie perpendicular to the direction of the current-collecting buses and are each brought toward the center of the substrate. The length of the portion of the connecting strip lying perpendicular to the direction of the current-collecting buses varies in the photovoltaic cells shown in the diagram of FIG. 7. Specifically, it will be noted in FIG. 7 that the portion of the connecting strips (191, 191') fixed to the photovoltaic cell (i) is shorter than the portion of the connecting strips (190, 190') fixed to the photovoltaic cell (i−1). This length variation allows the position of the current output terminals (185, 185', 186 and 186') to be shifted. This shift makes it possible to ensure that the current output terminals of the photovoltaic cells are not aligned on top of one another, which would make subsequent connection of the current output terminals to a junction box difficult and which could cause short-circuits between these terminals. It is possible to extend the connecting strips (190, 190') of the cell i−1 so that said strips pass through all the cells ranging from cell i to cell n and the encapsulants and protrude from the back face of the photovoltaic cell. The connecting-strip extension pieces are given the references 195 and 195' in FIG. 7. FIG. 8 shows the multielectrode photovoltaic device once assembled.

FIG. 9 shows, for a stack of four photovoltaic cells, that the length of the connecting strip perpendicular to the direction of the current-collecting buses gets smaller from the front photovoltaic call to the back photovoltaic cell. The lengths of the connecting strips lying perpendicular to the direction of the current-collecting buses are identical for the two electrodes of a given photovoltaic cell.

It is necessary to electrically isolate the two connecting strips of the electrode located on face A of the substrate. To do this, a strip of insulating material is placed between face A and the two connecting strips.

According to an embodiment, the current output terminals protrude from the substrate and lie in a plane parallel to the substrate. This is known as en "edge face electrode" configuration (FIGS. 10a and 10b). The current output terminals of the cell i are extended so that they protrude from the edge face (or side face) of the substrates and encapsulant. The device consisting of the stack of photovoltaic cells has a parallelepiped shape comprising an upper face, a lower face and four side faces. The upper face is the face that receives the light. The "edge face electrode" configuration corresponds to the current output terminals exiting from one of the side faces of the photovoltaic device. After assembly of the various elements of the photovoltaic device, it will be noted that the current output terminals (185, 186, 187, 188, 185', 186', 187' and 188') are shifted relative to one another. The expression "shifted current output terminals" is understood to mean that no two current output terminals are located in a given plane perpendicular to the plane formed by the upper face of the photovoltaic device.

In a different embodiment in which the connection is still made to the edge face (or side face) of the photovoltaic device, it is possible to provide plugs (400, 400') that cooperate with contacts (500, 500') located on the ends of the connecting strips (FIGS. 13a and 13b). The contacts may be located either on the edge face (or side face) of the photovoltaic cell, or in a housing (600, 600') located on the edge face (or side face) of the photovoltaic cell.

It is also possible to envision an embodiment such as shown in FIGS. 10c, 10d and 10e, in which the connecting-strip lengths lying perpendicular to the direction of the current-collecting buses are different for the two electrodes of a given photovoltaic cell.

Figure 11A:
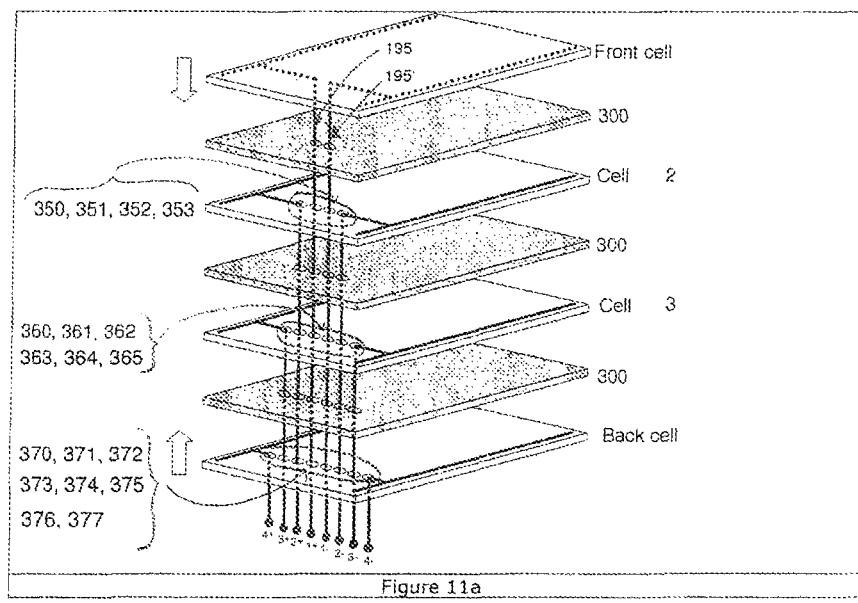
FIG. 11a is an example stack of four 2-electrode cells in the "back face electrode" configuration before assembly according to the disclosure.
Figure 11:
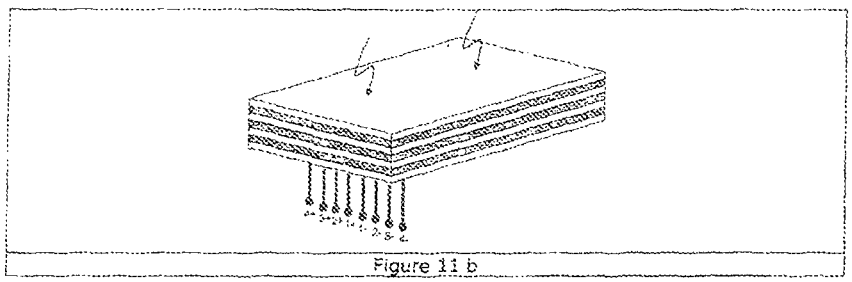
FIG. 11b is an example stack of four 2-electrode cells in the "back face electrode" configuration after assembly according to the disclosure.
FIG. 11c is an example stack of four 2-electrode cells in the "back face electrode" configuration before assembly in which the current output terminals are off-centered relative to the axis of the photovoltaic cell according to the disclosure.
Figure 11C:
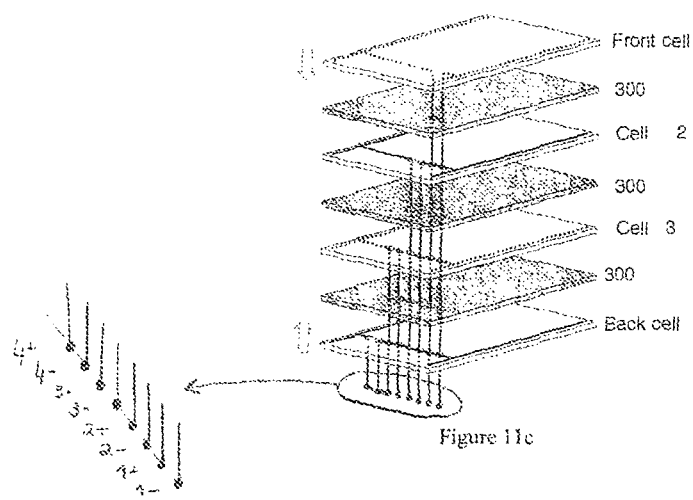

According to another embodiment, the current output terminals protrude from the substrate and lie in a plane perpendicular to the substrate. This is known as a "back face electrode" configuration (FIGS. 11a, 11b and 11c). The "back face electrode" configuration therefore corresponds to the current output terminals exiting from the lower face of the photovoltaic device.

In the case of production of a multifunction and multi-electrode photovoltaic cell in which the electrodes are located on the edge face (or side face) of the cell, it is not necessary for the substrates to have been drilled beforehand.

In the case of production of a muitijunction and multi-electrode photovoltaic cell in which the electrodes are located on the back face of the cell, it is necessary for the substrate to have been prepared beforehand. This is because, in order to allow the electrodes of each photovoltaic cell with two independent electrodes to reach the back face of the module, the substrates i=2 to n must be drilled with apertures to allow the current output terminals to pass (FIG. 11a). The cell 2 comprises 4 apertures (350, 351, 352, 363). The cell 3 comprises 6 apertures (360, 361, 362, 363). The back cell comprises 8 apertures (370, 371, 372, 373, 374, 375, 376, 377). For a given cell, the presence of 2 apertures each located at the ends of the set of apertures is optional. This is because, these two apertures may be absent provided that the connecting strips are placed on the lower face of the photovoltaic cell. However, their presence is necessary if the connecting strips are pieced on the upper face of the photovoltaic cell. The substrate of the front cell (i=1) has no drilled aperture. This is because the front cell serves as a cover for the final multielectrode photovoltaic cell. In addition, the internal ends of the connecting strips of the cell i coincide with apertures present in the encapsulant i (FIG. 11a). It is possible to extend the connecting strips of the cell i so that the connecting strip passes through all of the substrates and encapsulants and protrudes from the back face of the multielectrode photovoltaic cell, as was described with regard to FIG. 7.

Figure 12A:
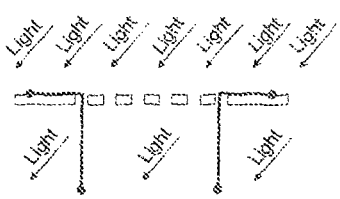
FIG. 12a is the way in which extension pieces of connecting strips pass from an intermediate two electrode cell i (1<i<n), arranged in the stack so that face E corresponds to face A and face S corresponds to face B, placed in a multijunction and multielectrode cell, in the "back face electrode" configuration.

It is important, when using extension pieces to extend the connecting strips (196, 195'), to ensure that these extension pieces exit from face S of the substrate. In this case, when the intermediate two-electrode photovoltaic cell i ($1<i<n$) is placed in the stack so that face E corresponds to face A and face S corresponds to face B, it is necessary to ensure that the extension pieces of the connecting strips of the photovoltaic cell i pass through apertures drilled in the substrate i and provided for this purpose (FIG. 12a).

Figure 12B:
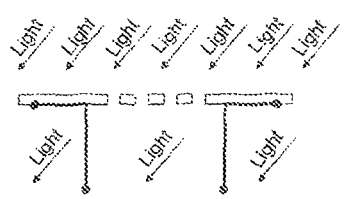
FIG. 12b is the way in which extension pieces of connecting strips pass from an intermediate two-electrode cell.

When the intermediate two-electrode photovoltaic cell i ($1<i<n$) is placed in the stack so that face E corresponds to face B and face S to face A, the extension pieces of the connecting strips of the photovoltaic cell i do not pass through the apertures in the substrate i (FIG. 12b).

When the intermediate two-electrode photovoltaic cell i ($1<i<n$) is placed in the stack so that face E corresponds to face B and face S corresponds to face A, the substrate i supporting the photovoltaic cell i will comprise 2i apertures drilled beforehand in a line parallel to one of the edges of the substrate. For this substrate, the 2(i−1) central apertures coincide with the apertures drilled in the interlayer (i−1). The substrate may comprise two additional apertures on either side of these apertures.

When the intermediate two-electrode photovoltaic cell i ($1<i<n$) is placed in the stack so that face E corresponds to face A and face S corresponds to face B, the substrate supporting the photovoltaic cell i will comprise 2(i−1) apertures drilled in a line parallel to one of the edges of the substrate. For this substrate, the 2(i−1) central apertures coincide with the apertures drilled in the interlayer i.

The substrate of the back cell (i=n) will comprise 2n apertures drilled in a line parallel to one of the edges of the substrate. For this substrate, the 2(n−1) central apertures correspond to the apertures drilled in the interlayer (n−1). The substrate may also comprise two additional apertures on either side of these apertures.

So as not to reduce the overall conversion efficiency of the final multielectrode photovoltaic module, it is preferable to locate the collecting buses and current output terminals of each of the cells in the same place.

It is possible not to use connecting-strip extension pieces. The electrical connection between each photovoltaic cell and the junction box is then made possible by virtue of plugs (400, 400') of different lengths which cooperate with contacts (500, 500') placed on the back face of the photovoltaic cell (FIGS. 14a and 14b).

The placement and soldering of the various collecting buses and connecting strips may be carried out manually. However, typically this operation is carried out using an automatic system. The electrical collecting buses and the current output terminals may be metal ships such as silver ribbons covered with nickel, nickel ribbons covered with silver, tin beads, copper ribbons covered with fin, tin ribbons covered with copper or any other material which allows the current generated by the photovoltaic cell to be transported and which can be soldered to the electrodes of the photovoltaic cell.

Choice of Lamination Interlayers:

Once each of the front, intermediate and back photovoltaic cells has been independently manufactured they are joined to one another via an (encapsulant) lamination interlayer.

The lamination interlayer chosen to join the two-electrode cells into a multijunction and multielectrode cell should: provide mechanical protection, act as a barrier to water vapor and oxygen, provide electrical isolation, act as a shock absorber, not be a source of corrosion of the materials of the cell, have adhesive properties.

The choice may for example be made from elastomers such as for example ethylene/vinyl acetate (EVA), polyurethane resins (PUR), polyacrylate resins or silicones and thermoplastics such as polyvinyl butyral (PVB), polyurethane thermoplastics (PUTS) and certain modified polyolefins (EPDM, DMP), for example. Other lamination interlayers may be used with the EVA or instead of the latter, for example a plastic of the Tedlar®, Nuvasil® or Tefzel® type, or UV-setting coatings and combinations of the above.

The lamination interlayer is as transparent as possible and is highly transmissive to solar radiation in the wavelength range corresponding to the absorption spectrum of the materials forming the absorbing material of the photovoltaic cell i and of all of the following photovoltaic cells (from i+1 to n), so as not to reduce the efficiency of the photovoltaic module.

Preparation of the Encapsulants:

In one aspect, substantially all of the encapsulants are substantially the same size as the substrates.

When a multijunction and multielectrode photovoltaic cell is produced the electrodes of which are located on the edge face (or side face) of the cell, it is not necessary for the encapsulants to be prepared in advance (FIGS. 10a and b).

When a multifunction and multielectrode photovoltaic cell is produced the electrodes of which are located on the back face of the cell, it is necessary for the encapsulants to be prepared beforehand. This is because, in order for the electrodes of each photovoltaic cell with two independent electrodes to reach the back face of the module, the encapsulants i=1 to (n−1) are drilled with apertures (FIG. 11a, 11b, 11c).

Generally, the encapsulant i located between the substrate of the cell i and the substrate of the cell (i+1) will comprise 2i apertures drilled beforehand in a line parallel to one of the edges of the substrate. For this substrate, the 2(i−1) central apertures are coincident with the apertures drilled in the substrate i.

A seal or sealing resin will also possibly be pieced between each substrate, either on the periphery of face S of the substrate or on the periphery of face E of the substrate (i+1), so as to provide an additional seat between substrates i and (i+1), especially with regard to moisture. This seal or sealing resin may for example be a hot-melt polymer such as ethylene/vinyl acetate or polyisobutylene or a mastic for example based on polyurethane, polysulfide or silicone.

Solder joints in apertures of the back substrate may then also be covered with epoxide, for example, with a view to providing additional protection with regard to the environment.

Assembly of the Multifunction and Multielectrode Photovoltaic Cell from Independent Two-Electrode Photovoltaic Cells and Lamination Interlayers:

The various two-electrode photovoltaic cells are joined to one another. To do this, the lamination interlayer 1 is pieced on the surface of face S of the photovoltaic cell 1. Face E of the cell 2 is then placed on the lamination interlayer 1. Generally, to join photovoltaic cells, the lamination interlayer i is deposited on the surface of face S of the photovoltaic cell i. Lastly, face E of the photovoltaic cell n is pieced on the surface of the lamination interlayer (n−1).

During this step of joining the various two-electrode photovoltaic cells, when a multifunction and multielectrode photovoltaic cell is to be produced the electrodes of which are located on the back face of the cell, it is necessary when placing the lamination interlayer i, to ensure that the apertures provided in the lamination interlayer i coincide with the internal ends of the connecting strips of the i preceding cells. Likewise, when placing the cell i, it is important to ensure that the apertures of the interlayer (n−1) coincide with the apertures of the substrate i.

When a multielectrode cell the electrodes of which are located on the back face of the cell makes use of connecting-strip extension pieces it is necessary to ensure that the extension pieces of the connecting strips of the i−1 preceding cells pass through coincident apertures in the lamination interlayer i and to pass the two extension pieces of the connecting strips of the photovoltaic cell i through two free apertures in the lamination interlayer i. Likewise, when placing the cell i, it is important to ensure that the apertures of the interlayer (i−1) coincide with the apertures of the substrate i (FIG. 11a).

In the case where contact is made to a multielectrode cell via the edge face (or side face) of the cell, it is important to ensure that the connecting strips of the two electrodes of the photovoltaic cell i, which are located on the edge face (or side face) of the substrate i, are not placed exactly above the connecting strips of the electrodes of the preceding (i−1) photovoltaic cells (FIG. 10b).

During this step of joining the various parts of the multijunction and multielectrode photovoltaic cell, it is necessary to ensure, in each step, that the substrates and lamination interlayers are well aligned with one another. This alignment may be carried out manually by operators or automatically using an image control, for example, and the use of robots enabling alignment.

The array comprising the stack of n two-electrode photovoltaic cells and the (n−1) interlayers is then placed in a laminating system which allows joining of the multifunction and multielectrode photovoltaic cell to be completed. This final lamination may for example be carried out in a vacuum laminator or in a roller laminator followed by processing in an autoclave.

The photovoltaic-cell module obtained in this way may be connected to one or more junction boxes via current output terminals that are all located on the same side of the module or on its edge face. The junction box ensures electrical connection of the module to a user interface, generally consisting of an electronic device allowing a DC voltage to be converted into an AC voltage compatible with the mains grid. Preferably, the module is connected to a single junction box. Preferably the single junction box is installed in the frame of the panel serving to support the photovoltaic-cell module for modules with side face electrodes and on the face S of the back cell for modules with back face electrodes.

Having described example embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A photovoltaic device comprising:
an assembly of n stacked photovoltaic cells, n being 2 or more, the assembly comprising:
  a front photovoltaic cell 1,
  at least one intermediate photovoltaic cell (1<i<n), if n is strictly greater than 2,
  a back photovoltaic cell n, and
a lamination interlayer placed between two photovoltaic cells, each photovoltaic cell comprising:
  two current output terminals,
  at least one photovoltaic junction,
  current-collecting buses, and
  connecting strips that extend from the current-collecting buses to the current output terminals, all the output terminals for current output being placed on the same face of the photovoltaic device,
wherein each intermediate photovoltaic cell comprising 2(i−1) apertures for passing extension pieces coming from the photovoltaic cells 1 to (i−1) and optionally two apertures for passing current output terminals from the photovoltaic cell i, the back photovoltaic cell n comprising 2(n−1) apertures for passing extension pieces coming from the photovoltaic cells 1 to (n−1) and optionally two apertures for passing current output terminals from the photovoltaic cell n.

2. The device as claimed in claim 1, in which the device is parallelepiped shaped and the current output terminals are placed on the lower or upper face of the parallelepiped.

3. The device as claimed in claim 2, in which the current output terminals are aligned, preferably near the side face of the device.

4. The device as claimed in claim 1, in which the current output terminals are wires.

5. The device as claimed in claim 1, in which the current output terminals are contacts at the ends of the connecting strips.

6. The device as claimed in claim 1, in which the back photovoltaic cell comprises a film of a light-reflecting material.

7. The device as claimed in claim 6, as a roof component, a roof for a building, or a non-transparent wall cladding for a building.

8. The device as claimed in claim 1, in which the back photovoltaic cell does not comprise a film of a light-reflecting material.

9. The device as claimed in claim 8, as a window component for a building.

10. The device as claimed in claim 1, in which the photovoltaic junction material is chosen from the group comprising: microcrystalline silicon; polymorphous silicon; amorphous silicon; cadmium telluride CdTe associated with a cadmium sulfide CdS buffer layer; the chalcopyrites $CuIn_{1-x}Ga_x(Se, S)_2$, where x lies between 0 and 1, associated with a cadmium sulfide CdS or indium sulfide $In_2S_3$ buffer layer; hydrogenated, amorphous alloys of silicon and germanium $Si_xGe_{1-x}$; and organic materials based on poly (3-hexylthiophene) and [6,6]-phenyl-C61-butyric acid methyl; and mixtures of the above.

11. The device as claimed in claim 1 in which two electrodes consisting of a transparent conductive oxide (TCO) are present on each face of the junction.

12. The device as claimed in claim 1, in which the current output terminals are gathered together in a junction box forming a first group consisting of positive current output terminals and a second group consisting of negative current output terminals.

13. The device as claimed in claim 1, in which the current output terminals are grouped in pairs, with each pair comprising a positive electrode and a negative electrode, each pair being placed in a junction box or all the pairs being placed in a single junction box.

14. The photovoltaic array comprising:
a device as claimed in claim 13,
a plurality of junction boxes.

15. A method for manufacturing a photovoltaic device as claimed in claim 1, comprising:
laminating stacked photovoltaic cells and lamination interlayers.

16. The method as claimed in claim 15, comprising:
stacking:
  the front photovoltaic cell 1,
  the apertured lamination interlayer, the apertures facing the current output terminals of the front photovoltaic cell 1, on which the lamination interlayer is deposited,
  at least one intermediate photovoltaic cell i, each intermediate photovoltaic cell i comprising 2(i−1) apertures for passing extension pieces coming from the photovoltaic cells 1 to (i−1) and optionally two apertures for passing current output terminals from the photovoltaic cell i;
the apertured lamination interlayer, the apertures facing the current output terminals of the photovoltaic cell i, on which the lamination interlayer is deposited, and
the back photovoltaic cell n comprising 2(n−1) apertures for passing extension pieces coming from the photovoltaic cells 1 to (n−1) and optionally two apertures for passing current output terminals from the photovoltaic cell n to form a stack; the method further comprising:
passing extension pieces and current output terminals through the apertures, and
laminating the stack, the lamination possibly being obtained by sequential operations after each cell or each interlayer has been deposited, or possibly being obtained in a single step after the cells and the interlayers have been assembled.

17. A photovoltaic array comprising:
an array of devices, each of the devices comprising:
  an assembly of n stacked photovoltaic cells, n being 2 or more, the assembly comprising:
    a front photovoltaic cell 1;
    at least one intermediate photovoltaic cell (1<i<n) if n is strictly greater than 2; and
    a back photovoltaic cell n, each intermediate photovoltaic cell i comprising 2(i−1) apertures for passing extension pieces coming from the photovoltaic cells 1 to (i−1) and optionally two apertures for passing current output terminals from the photovoltaic cell i, the back photovoltaic cell n comprising 2(n−1) apertures for passing extension pieces coming from the photovoltaic cells 1 to (n−1) and optionally two apertures for passing current output terminals from the photovoltaic cell n,
  a lamination interlayer placed between two photovoltaic cells, each photovoltaic cell comprising:
    two current output terminals,
    at least one photovoltaic junction, current-collecting buses, and
connecting strips that extend from the current-collecting buses to the current output terminals, all the output terminals for current output being placed on the same face of the photovoltaic device; and at least one junction box adapted to receive the current output terminals.

18. The photovoltaic array as claimed in claim 17, comprising a single junction box.

* * * * *